United States Patent
Chen et al.

(10) Patent No.: US 11,755,079 B2
(45) Date of Patent: Sep. 12, 2023

(54) COMPUTER DEVICE, CASING, AND WATER COOLING HEAT DISSIPATION DEVICE

(71) Applicant: COOLER MASTER CO., LTD., Taipei (TW)

(72) Inventors: Ying-Chun Chen, Taipei (TW); Yu-Te Wei, Taipei (TW); Tsung-Wei Lin, Taipei (TW)

(73) Assignee: COOLER MASTER CO., LTD., Taipei (TW)

(*) Notice: Subject to any disclaimer, the term of this patent is extended or adjusted under 35 U.S.C. 154(b) by 73 days.

(21) Appl. No.: 17/558,196

(22) Filed: Dec. 21, 2021

(65) Prior Publication Data
US 2022/0248566 A1    Aug. 4, 2022

(30) Foreign Application Priority Data
Jan. 29, 2021 (TW) ................. 110103362

(51) Int. Cl.
*G06F 1/20* (2006.01)
*H05K 7/20* (2006.01)

(52) U.S. Cl.
CPC .......... *G06F 1/20* (2013.01); *H05K 7/20254* (2013.01); *H05K 7/20263* (2013.01); *H05K 7/20272* (2013.01); *H05K 7/20409* (2013.01); *G06F 2200/201* (2013.01)

(58) Field of Classification Search
CPC . G06F 1/20; G06F 2200/201; H05K 7/20254; H05K 7/20263; H05K 7/20272; H05K 7/20409
See application file for complete search history.

(56) References Cited

U.S. PATENT DOCUMENTS

| 6,234,240 | B1* | 5/2001 | Cheon | G06F 1/20 165/185 |
| 8,760,865 | B2* | 6/2014 | Tang | G06F 1/20 361/698 |
| 2002/0122297 | A1* | 9/2002 | Dong | G06F 1/20 361/679.52 |
| 2005/0067145 | A1* | 3/2005 | Matsushita | G06F 1/20 257/E23.098 |

(Continued)

FOREIGN PATENT DOCUMENTS

CN    107844176 A *  3/2018

*Primary Examiner* — Zachary Pape
(74) *Attorney, Agent, or Firm* — Maschoff Brennan

(57) ABSTRACT

A computer includes a casing, an electronic assembly, and a water cooling assembly. The casing, forms an accommodation space. The casing has an interior fluid channel located at at least one side of the casing, and a fluid inlet and a fluid outlet which are in fluid communication with the interior fluid channel. The electronic assembly is located in the accommodation space. The water cooling assembly includes a first water block and a radiator. The first water block is in thermal contact with the electronic assembly, the first water block, the radiator, and the interior fluid channel located at the at least one side of the casing are in fluid communication with each other so as to form a circulation channel, and the fluid inlet and the fluid outlet of the casing are respectively in fluid communication with the radiator and the first water block.

16 Claims, 13 Drawing Sheets

(56) References Cited

U.S. PATENT DOCUMENTS

| | | | | |
|---|---|---|---|---|
| 2005/0126806 | A1* | 6/2005 | Meng-Cheng | G06F 1/20 |
| | | | | 174/17 VA |
| 2007/0227709 | A1* | 10/2007 | Upadhya | H05K 7/20154 |
| | | | | 165/80.4 |
| 2007/0297138 | A1* | 12/2007 | Huang | H05K 7/20272 |
| | | | | 361/699 |
| 2009/0323286 | A1* | 12/2009 | Han | G06F 1/20 |
| | | | | 361/702 |
| 2011/0110029 | A1* | 5/2011 | Lodhia | G06F 1/20 |
| | | | | 361/679.46 |
| 2018/0299931 | A1* | 10/2018 | Li | H05K 7/20263 |

* cited by examiner

COMPUTER DEVICE, CASING, AND WATER COOLING HEAT DISSIPATION DEVICE

CROSS-REFERENCE TO RELATED APPLICATIONS

This non-provisional application claims priority under 35 U.S.C. § 119(a) on Patent Application No(s). 110103362 filed in Taiwan, R.O.C. on Jan. 29, 2021, the entire contents of which are hereby incorporated by reference.

TECHNICAL FIELD

The disclosure relates to a computer device, a casing, and a water cooling heat dissipation device, more particularly to a computer device, a casing, and a water cooling heat dissipation device having a water block.

BACKGROUND

In general, a computer mainly has a casing, a power supply, a motherboard, a central processor, a graphics card and an expansion card. The power supply and the motherboard are disposed in the casing, and the central processor, the graphics card, and the expansion card are installed on the motherboard. When the computer is in operation, the central processor performs data computing, and the graphics card performs image computing, and both generate a large amount of heat. Therefore, at least one fan is installed in the casing for dissipating heat generated by the central processor and the graphics card. During the operation of the fan, an airflow is conducted into the casing and flows through the central processor and the graphics card so as to take heat generated therefrom out of the casing.

The more powerful the performances of the central processor and the graphics card are, a larger amount of heat the central processor and the graphics card generate. Therefore, heat generated by the central processor and the graphics card may interact with each other, resulting in the difficulty of the heat dissipation. Accordingly, how to improve the heat dissipation efficiency of the computer is one of the crucial topics in this field.

SUMMARY

The disclosure is to provide a computer device, a casing, and a water cooling heat dissipation device which are capable of improving the dissipation efficiency.

One embodiment of the disclosure provides a computer device. The computer includes a casing, an electronic assembly, and a water cooling assembly. The casing, forms an accommodation space. The casing has an interior fluid channel located at at least one side of the casing, and a fluid inlet and a fluid outlet which are in fluid communication with the interior fluid channel. The electronic assembly is located in the accommodation space. The water cooling assembly includes a first water block and a radiator. The first water block is in thermal contact with the electronic assembly, the first water block, the radiator, and the interior fluid channel located at the at least one side of the casing are in fluid communication with each other so as to form a circulation channel, and the fluid inlet and the fluid outlet of the casing are respectively in fluid communication with the radiator and the first water block.

Another embodiment of the disclosure provides a casing. The casing includes a plurality of side plates and a first heat dissipation plate. The plurality of side plates and the first heat dissipation plate together form an accommodation space, and the first heat dissipation plate has an interior fluid channel, and a fluid inlet and a fluid outlet which are in fluid communication with the interior fluid channel.

Still another embodiment of the disclosure provides a water cooling heat dissipation device. The water cooling heat dissipation device is configured to be thermally coupled with two heat sources. The water cooling heat dissipation device includes a first water block, a cold plate, a radiator, and a first heat dissipation plate. The first water block has a fluid inlet and a fluid outlet. The cold plate has a fluid inlet and a fluid outlet. The first water block and the cold plate are respectively and thermally coupled with the heat sources. The radiator has a fluid inlet and a fluid outlet. The fluid inlet and the fluid outlet of the radiator are respectively in fluid communication with the fluid outlet of the first water block and the fluid inlet of the cold plate. The first heat dissipation plate has an interior fluid channel, and a fluid inlet and a fluid outlet which are in fluid communication with the interior fluid channel, the fluid inlet and the fluid outlet of the first heat dissipation plate are respectively in fluid communication with the fluid outlet of the cold plate and the fluid inlet of the first water block.

According to the computer device, the casing, and the water cooling heat dissipation device as described in the above embodiments, a part of the casing can be served as at least one heat dissipation plate for the working fluid to flow therein, such that the heat dissipation efficiency can be improved while not increasing the volume of the computer device as possible.

Moreover, the circulation channel is formed by connecting at least one water block, the radiator, the cold plate, and the heat dissipation plate via at least one pump, such that the heat dissipation efficiency can be further improved.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
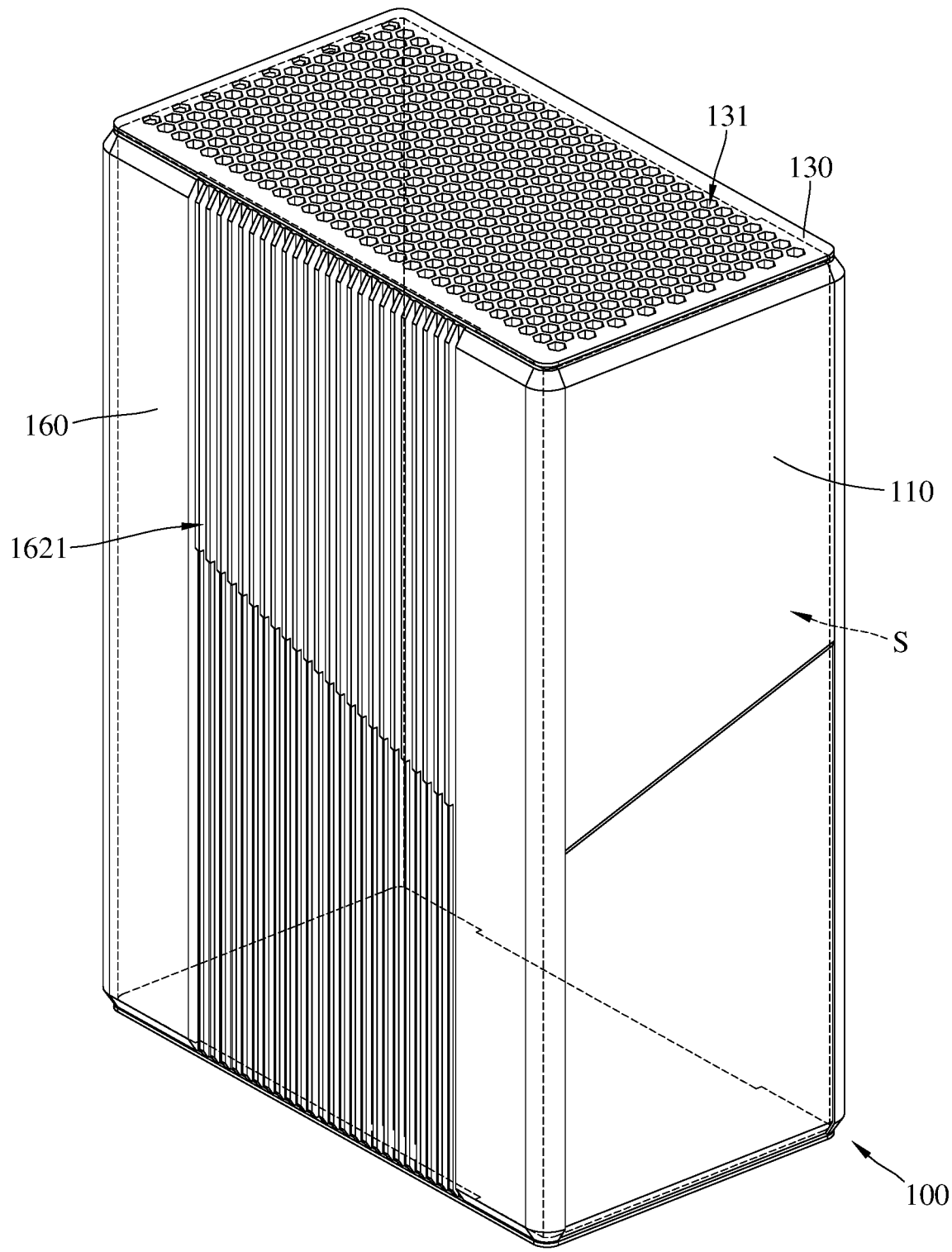
FIG. 1 is a perspective view of a computer device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
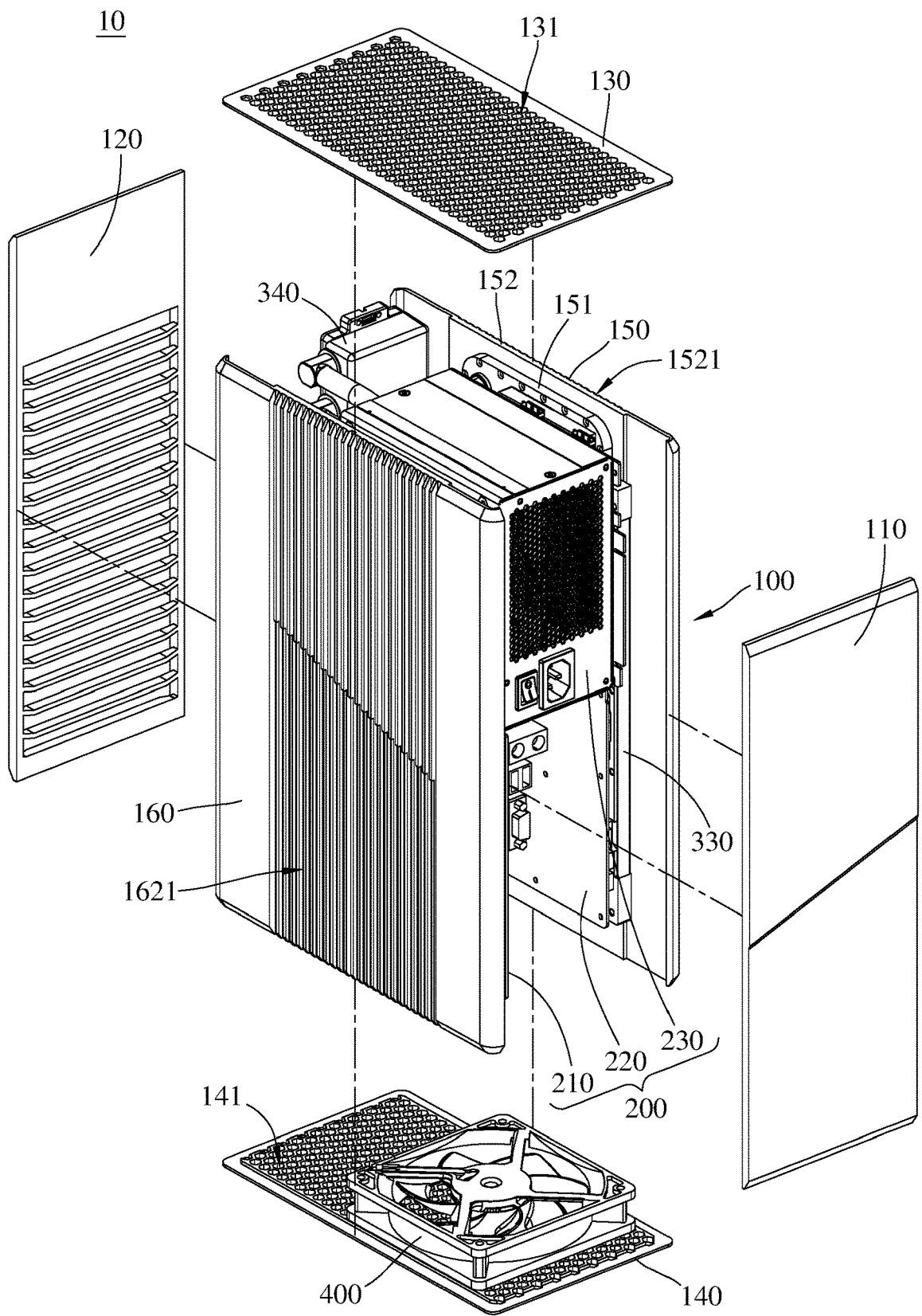
FIG. 2 is a partial exploded view of the computer device in FIG. 1.
Figure 3:
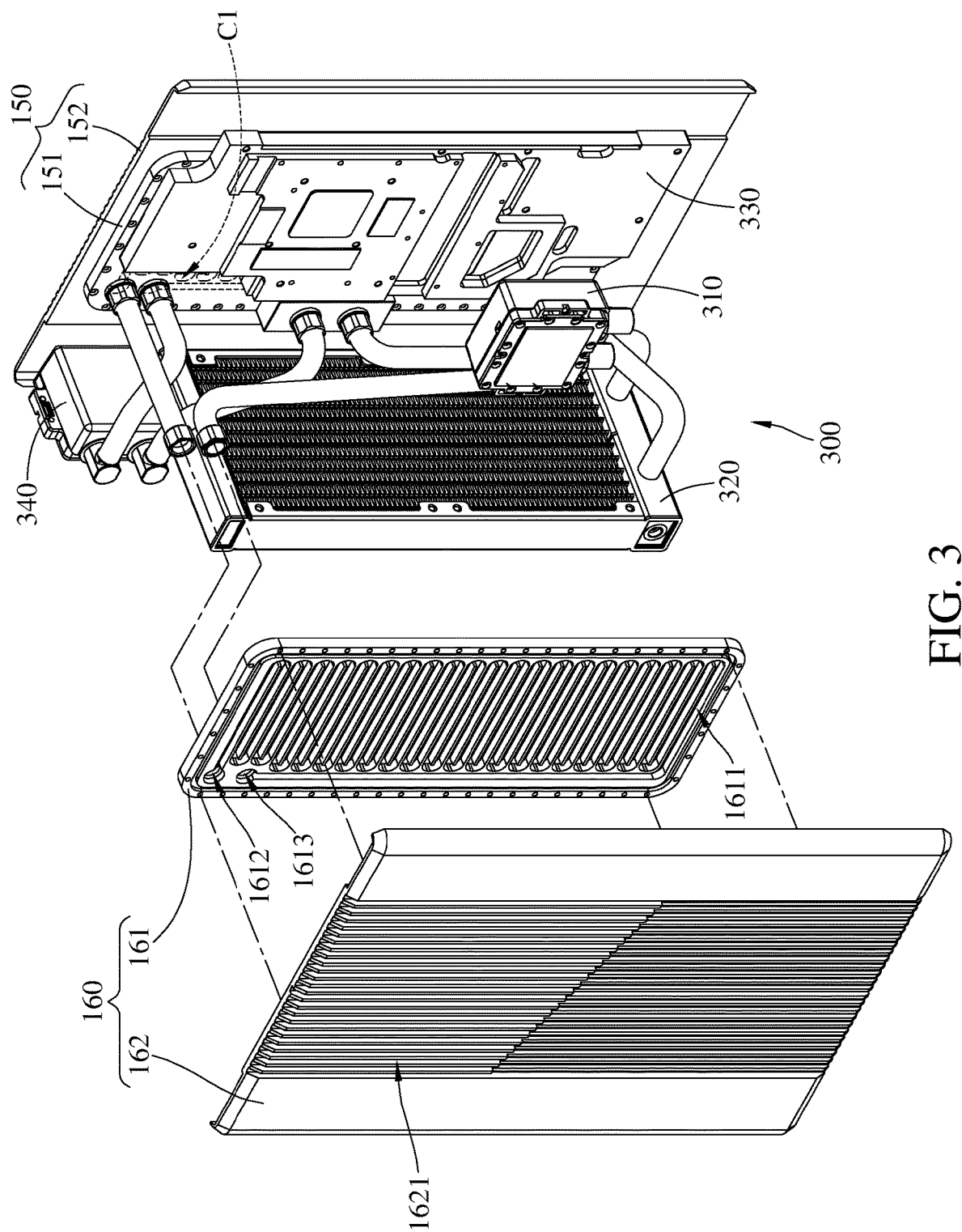
FIG. 3 is another partial exploded view of the computer device in FIG. 1.
Figure 4:
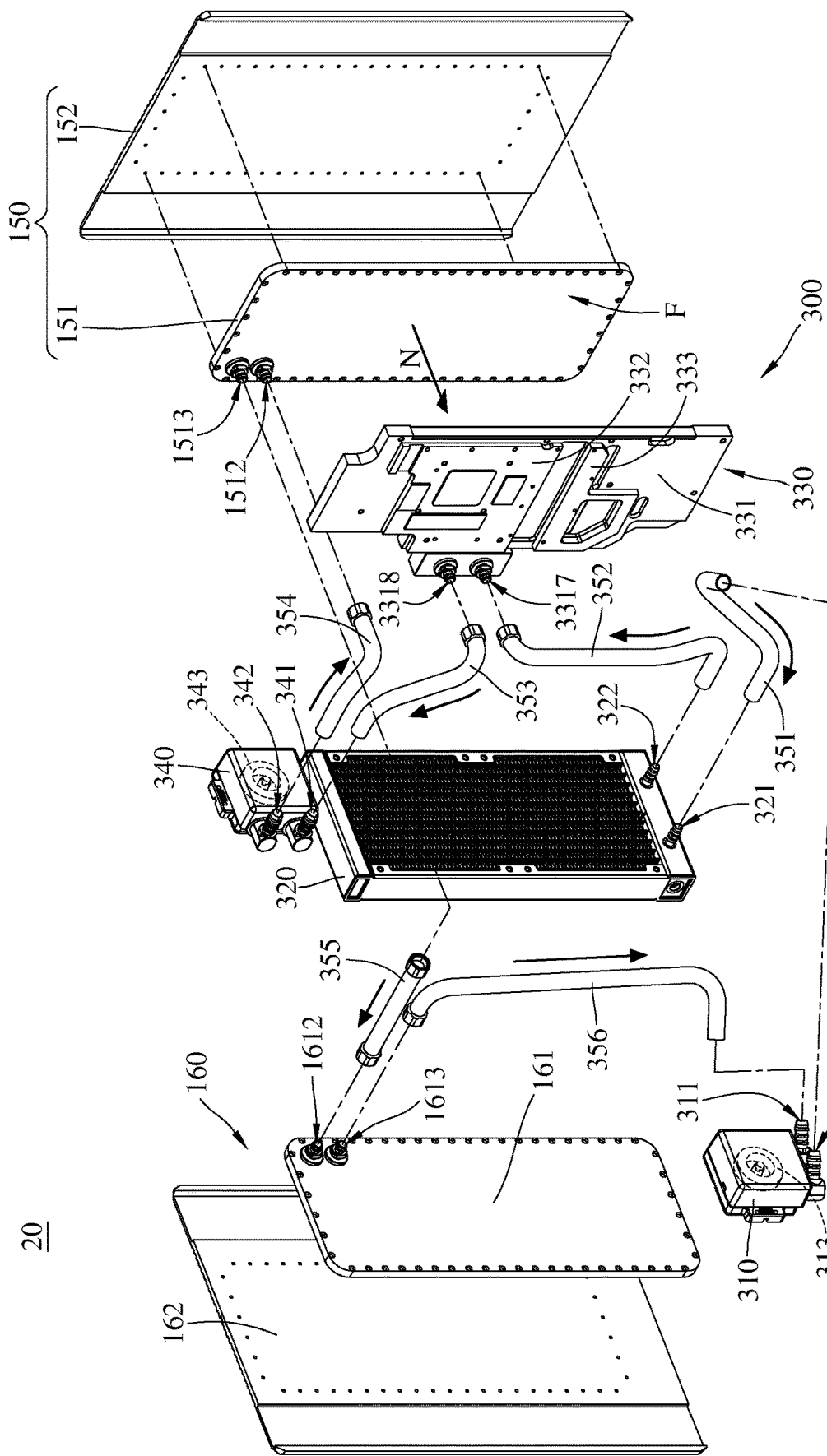
FIG. 4 is an exploded view of the computer device in FIG. 3.
Figure 5:
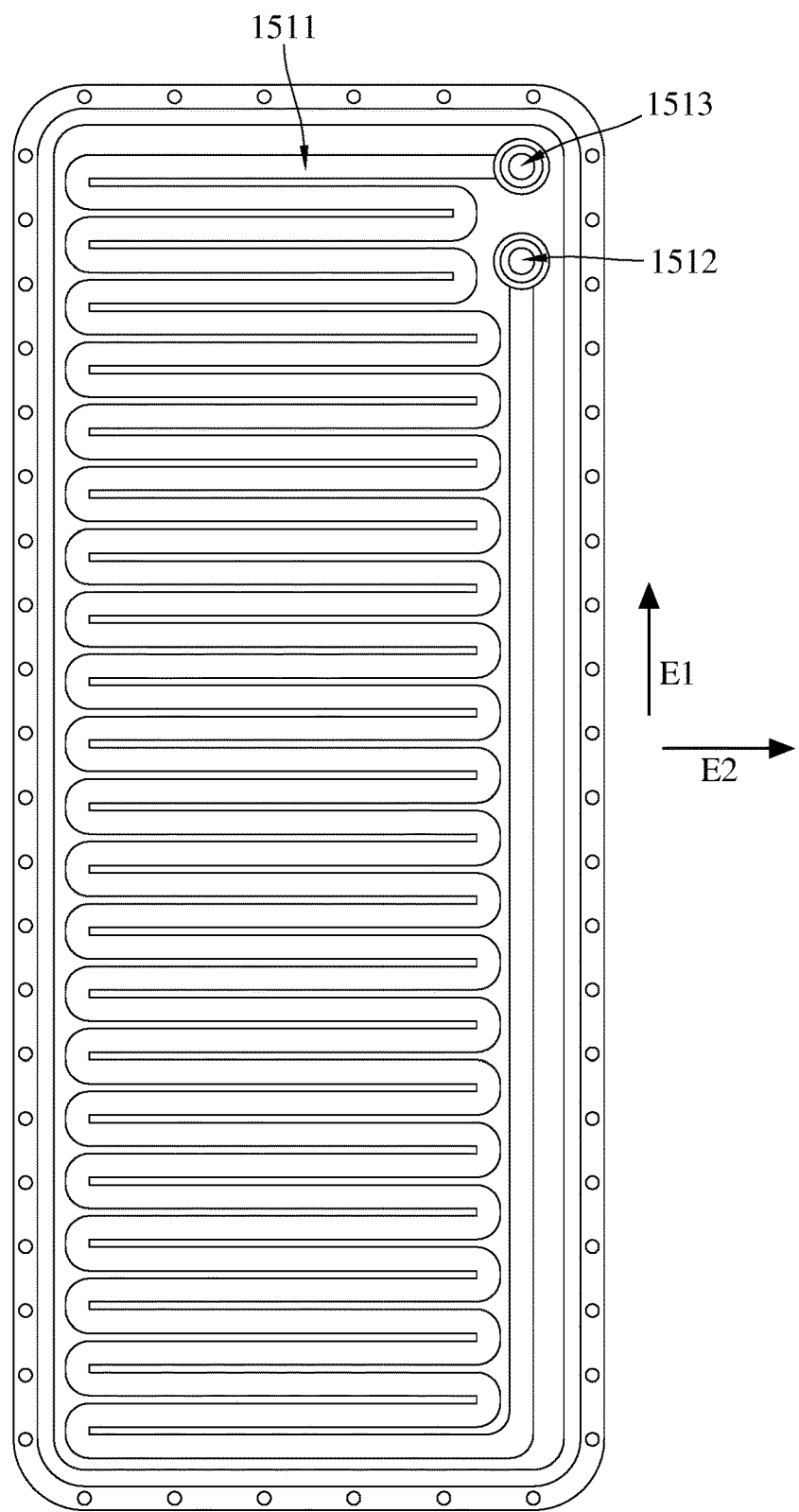
FIG. 5 is a schematic view of an inner plate of a first heat dissipation plate in FIG. 3.

Referring to FIGS. 1 to 5, FIG. 1 is a perspective view of a computer device 10 according to a first embodiment of the disclosure, FIG. 2 is a partial exploded view of the computer device 10 in FIG. 1, FIG. 3 is another partial exploded view of the computer device 10 in FIG. 1, FIG. 4 is an exploded view of the computer device 10 in FIG. 3, and FIG. 5 is a schematic view of an inner plate 151 of a first heat dissipation plate 150 in FIG. 3.

In this embodiment, the computer device 10 includes a casing 100, an electronic assembly 200, and a water cooling assembly 300.

The casing 100 includes a plurality of side plates 110, 120, 130, and 140, a first heat dissipation plate 150, and a second heat dissipation plate 160. The side plates 110, 120, 130, and 140, the first heat dissipation plate 150, and the second heat dissipation plate 160 together form an accommodation space S. That is, the first heat dissipation plate 150 and the second heat dissipation plate 160 are exterior parts of the computer device 10 which can be directly viewed from outside of the computer device 10. Since the computer device 10 and any conventional computer both have exterior parts, additionally arranging an interior fluid channel C1 in at least one of the exterior parts of the computer device 10 for helping the heat dissipation can prevent the cost and volume of the computer device 10 from overly increasing when comparing to the conventional computer.

Specifically, the side plate 110 and the side plate 120 are respectively located at two opposite sides (e.g., a front side and a rear side) of the casing 100, and the side plate 130 and the side plate 140 are respectively located at two opposite sides (e.g., an upper side and a lower side) of the casing 100. The side plate 130 has a plurality of vent holes 131, and the side plate 140 has a plurality of vent holes 141.

Note that the quantities of vent holes 131 and the vent holes 141 are not restricted in the disclosure, and both of them may be modified to be one in another embodiment.

The first heat dissipation plate 150 and the second heat dissipation plate 160 are respectively located at two opposite sides (e.g., a left side and a right side) of the casing 100. As shown in FIG. 5, the first heat dissipation plate 150 includes an inner plate 151 and an outer plate 152. The inner plate 151 has a groove 1511, and a fluid inlet 1512 and a fluid outlet 1513 which are in fluid communication with the groove 1511. The outer plate 152 is stacked on the inner plate 151 and covers the groove 1511 of the inner plate 151, such that the outer plate 152 and the inner plate 151 together form an interior fluid channel C1. Extension direction E1 and E2 (as shown in FIG. 5) of the interior fluid channel C1 of the first heat dissipation plate 150 are, for example, perpendicular to a normal line N of a surface F of the inner plate 151. In addition, the outer plate 152 has a plurality of heat dissipation fins 1521 for increasing the heat dissipation performance of the first heat dissipation plate 150.

The second heat dissipation plate 160 are similar to the first heat dissipation plate 150. Similarly, the second heat dissipation plate 160 includes an inner plate 161 and an outer plate 162. The inner plate 161 has a groove 1611, and a fluid inlet 1612 and a fluid outlet 1613 which are in fluid communication with the groove 1611. The outer plate 162 is stacked on the inner plate 161 and covers the groove 1611 of the inner plate 161, such that the outer plate 162 and the inner plate 161 together form another interior fluid channel (similar to the interior fluid channel C1 of the first heat dissipation plate 150). Similarly, extension directions (similar to the directions E1 and E2 as shown in FIG. 5) of the interior fluid channel of the second heat dissipation plate 160 are, for example, perpendicular to a normal line of a surface of the inner plate 161 (similar to the normal line N of the surface F of the inner plate 151). In addition, the outer plate 162 has a plurality of heat dissipation fins 1621 for increasing the heat dissipation performance of the second heat dissipation plate 160.

In this embodiment, the casing 100 is in a cuboid shape, but the disclosure is not limited thereto; in some other embodiments, the casing may be in a spherical shape or hexagonal prism shape.

The electronic assembly 200 is located in the accommodation space S. Specifically, the electronic assembly 200 includes a motherboard 210, a graphics card 220, and a power supply 230. The motherboard 210 has a central processor 211. The graphics card 220 has an image processor 221.

Note that the electronic assembly 200 is not restricted to including the motherboard 210, the graphics card 220, and the power supply 230; in some other embodiments, the electronic assembly may merely include the motherboard and the graphics card, or may merely include other types of two heat sources.

The water cooling assembly 300 includes a first water block 310, a radiator 320, a cold plate 330, and a second water block 340. In addition, the water cooling assembly 300 may further include a first tube 351, a second tube 352, a third tube 353, a fourth tube 354, a fifth tube 355, and a sixth tube 356. A fluid outlet 312 of the first water block 310 is in fluid communication with a fluid inlet 321 of the radiator 320 via the first tube 351. A fluid outlet 322 of the radiator 320 is in fluid communication with a fluid inlet 3317 of the cold plate 330 via the second tube 352. A fluid outlet 3318 of the cold plate 330 is in fluid communication with a fluid inlet 341 of the second water block 340 via the third tube 353. A fluid outlet 342 of the second water block 340 is in fluid communication with the fluid inlet 1512 of the first heat dissipation plate 150 via the fourth tube 354. The fluid outlet 1513 of the first heat dissipation plate 150 is in fluid communication with the fluid inlet 1612 of the second heat dissipation plate 160 via the fifth tube 355, and the fluid outlet 1613 of the second heat dissipation plate 160 is in fluid communication with a fluid inlet 311 of the first water block 310 via the sixth tube 356. As a result, the first water block 310, the second water block 340, the radiator 320, an interior fluid channel C2 of the cold plate 330, the interior fluid channel C1 of the first heat dissipation plate 150, and the interior fluid channel of the second heat dissipation plate 160 are in fluid communication with each other so as to form a circulation channel. A working fluid, such as water or refrigerant is filled in the circulation channel and can be driven to flow along the direction (indicated by arrows shown in FIG. 4) for performing a cooling circulation.

Referring to FIGS. 2 to 6, FIG. 6 is a partial side view of the computer device 10 in FIG. 2. The first water block 310 is in thermal contact with the central processor 211 of the motherboard 210. The working fluid can absorb heat generated by the central processor 211 while flowing through the first water block 310, and then heat absorbed by the working fluid can be dissipated to outside by the radiator 320 to cool the working fluid while the working fluid flows through the radiator 320.

The cold plate 330 is in thermal contact with the image processor 221 of the graphics card 220. The working fluid cooled by the radiator 320 can absorb heat generated by the image processor 221 while flowing through the cold plate 330, and then the first heat dissipation plate 150 and the second heat dissipation plate 160 can dissipate heat absorbed by the working fluid to outside so as to cool the working fluid while the working fluid flows through the first heat dissipation plate 150 and the second heat dissipation plate 160. After the working flows through the first heat dissipation plate 150 and the second heat dissipation plate 160 so as to be cooled, the working fluid flows back to the first water block 310 to cool the central processor 211.

Note that the water cooling assembly 300 is not restricted to simultaneously including the first water block 310, the radiator 320, the cold plate 330, and the second water block 340 in the disclosure. The following paragraphs will introduce the water cooling assembly 300 of other embodiments.

In another embodiment, the water cooling assembly may merely include the first water block 310, the radiator 320, and the cold plate 330. That is, the fluid outlet 3318 of the cold plate 330 may be directly in fluid communication with the fluid inlet 1512 of the first heat dissipation plate 150. In this case, the first water block 310, the radiator 320, the cold plate 330, the interior fluid channel C1 of the first heat dissipation plate 150, and the interior fluid channel of the second heat dissipation plate 160 may together form the circulation channel.

In still another embodiment, the water cooling assembly may merely include the first water block 310, the radiator 320, and the second water block 340. That is, the fluid outlet 322 of the radiator 320 may be directly in fluid communication with the fluid inlet 341 of the second water block 340. In this case, the first water block 310, the radiator 320, the second water block 340, the interior fluid channel C1 of the first heat dissipation plate 150, and the interior fluid channel of the second heat dissipation plate 160 may together form the circulation channel. Moreover, the second water block 340 may be in thermal contact with the image processor 221 of the graphics card 220.

In yet still another embodiment without the graphics card, the water cooling assembly may merely include the first water block 310 and the radiator 320. In this case, the first water block 310, the radiator 320, the interior fluid channel C1 of the first heat dissipation plate 150, and the interior fluid channel of the second heat dissipation plate 160 may together form the circulation channel. Furthermore, one of the first heat dissipation plate 150 and the second heat dissipation plate 160 of the casing may be omitted. In such a case, the first water block 310, the radiator 320, and the interior fluid channel C1 of the first heat dissipation plate 150 or the interior fluid channel of the second heat dissipation plate 160 together form the circulation channel.

Note that the first water block 310 is not restricted to having the pump 313, and the second water block 340 is not restricted to having the pump 343; in some other embodiments, the pump of the first water block or the pump of the second water block may be omitted. Alternatively, the pump of the first water block and the pump of the second water block both may be omitted, and a pump may be additionally provided in a suitable position of the circulation channel.

In this embodiment, the radiator 320 has at least one fan for helping the heat dissipation, but the disclosure is not limited thereto; in some other embodiments, the fan of the radiator 320 may be omitted.

Figure 6:
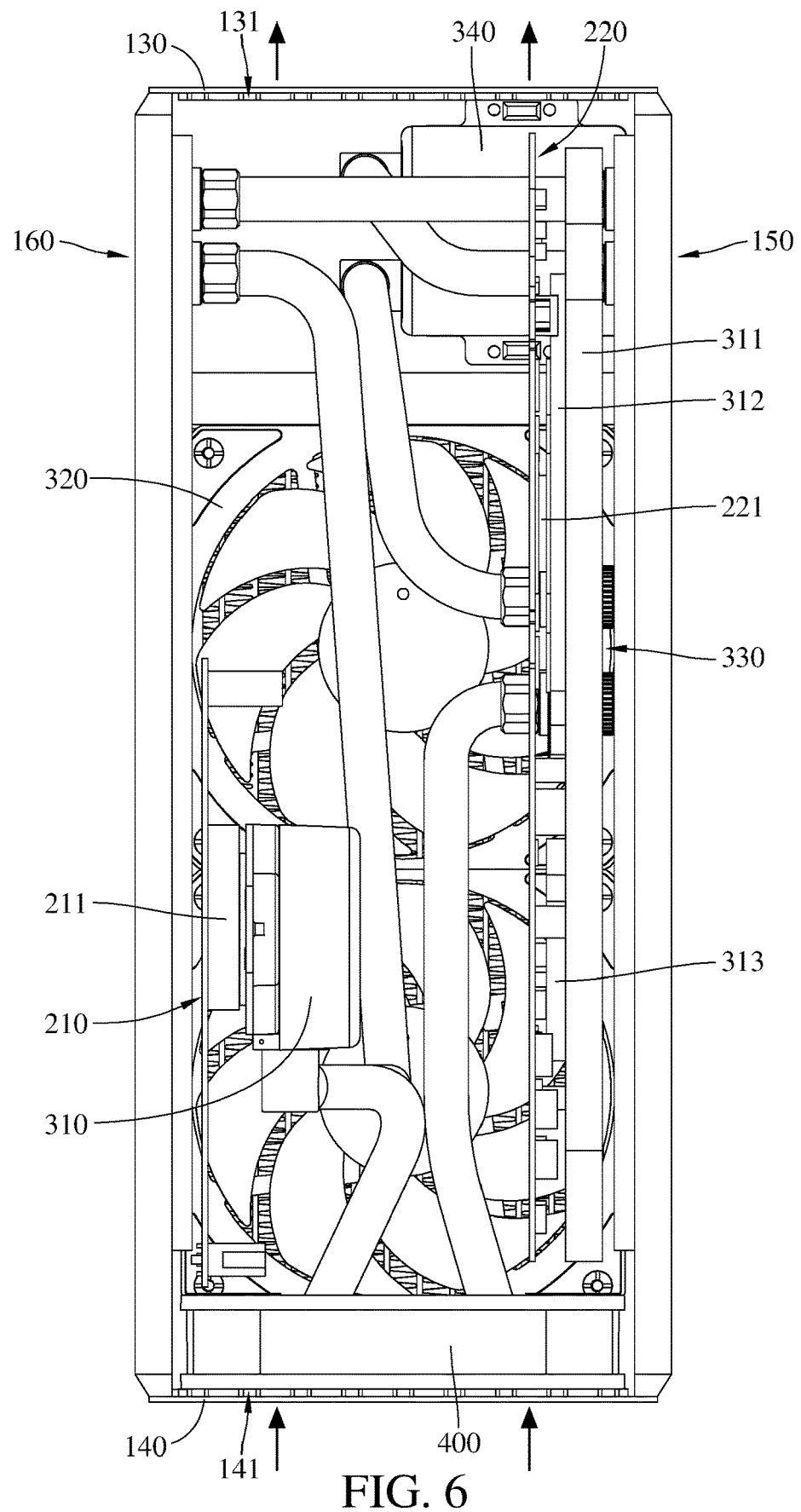
FIG. 6 is a partial side view of the computer device in FIG. 2.

As shown in FIGS. 2 and 6, the computer device 10 may further include an airflow generator 400. The airflow generator 400 is, for example, a fan. The airflow generator 400 is disposed on the side plate 140 and located adjacent to the vent holes 141 of the side plate 140. When the airflow generator 400 is in operation, the airflow generator 400 produces an airflow along a direction indicated by arrows so as to take heat out of the accommodation space S from the side plate 130. Note that the airflow generator 400 is optional and may be omitted in some other embodiments. In such a case, heat may be taken out of the accommodation space S from the side plate 130 by the nature convection.

Figure 7:
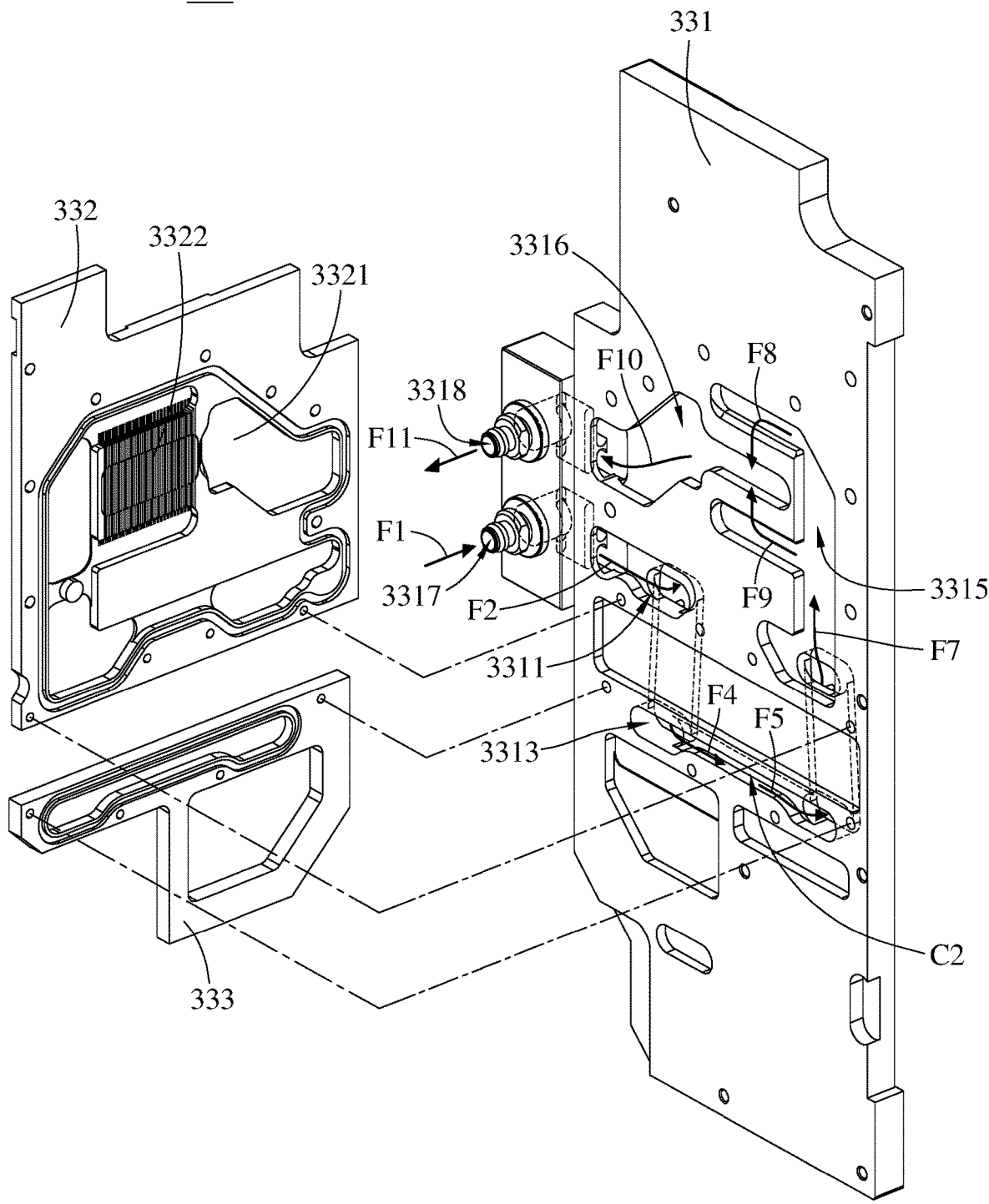
FIG. 7 is an exploded view of a cold plate in FIG. 3.
Figure 8:
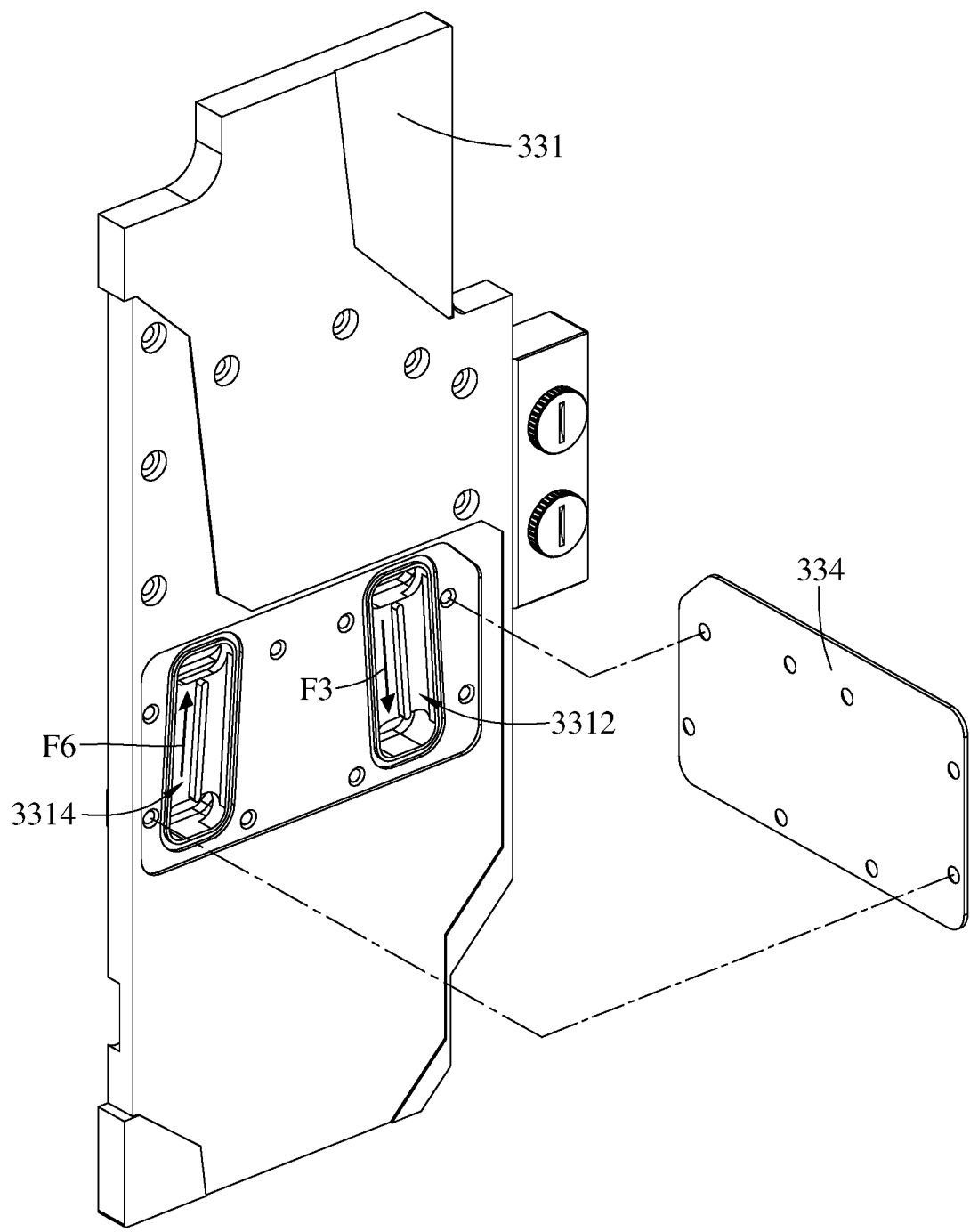
FIG. 8 is another exploded view of the cold plate in FIG. 3.

Referring to FIGS. 7 and 8, FIG. 7 is an exploded view of the cold plate 330 in FIG. 3, and FIG. 8 is another exploded view of the cold plate 330 in FIG. 3.

In this embodiment, the cold plate 330 includes a main part 331, a first cover part 332, a second cover part 333, and a third cover part 334. The main part 331 has an interior fluid channel C2 having a first channel 3311, a second channel 3312, a third channel 3313, a fourth channel 3314, a fifth channel 3315, and a sixth channel 3316. The first channel 3311, the third channel 3313, the fifth channel 3315, and the sixth channel 3316 are located at one side of the main part 331 and spaced apart from one another. The second channel 3312 and the fourth channel 3314 are located at another side of the main part 331 and spaced apart from each other. The first channel 3311 is in fluid communication with the third channel 3313 via the second channel 3312. The third channel 3313 is in fluid communication with the fifth channel 3315 via the fourth channel 3314. In addition, the fluid inlet 3317 of the cold plate 330 is in fluid communication with the first channel 3311, and the fluid outlet 3318 of the cold plate 330 is in fluid communication with the sixth channel 3316.

The first cover part 332 has a communication channel 3321 and a heat dissipation fin 3322, and the heat dissipation fin 3322 is located in the communication channel 3321. The first cover part 332 covers the first channel 3311, the fifth channel 3315, and the sixth channel 3316, and the fifth channel 3315 is in fluid communication with the sixth channel 3316 via the communication channel 3321 of the first cover part 332. The second cover part 333 covers the third channel 3313, and the third cover part 334 covers the second channel 3312 and the fourth channel 3314.

The working fluid flows into the fluid inlet 3317 along a direction F1, and then sequentially flows through the first channel 3311, the second channel 3312, the third channel 3313, the fourth channel 3314, the fifth channel 3315, the communication channel 3321, the sixth channel 3316, and the fluid outlet 3318 along directions F2-F11.

In this embodiment, the first water block 310, the radiator 320, the cold plate 330, the second water block 340, the first heat dissipation plate 150, and the second heat dissipation plate 160 together form a water cooling heat dissipation device 20 (as shown in FIG. 4) for dissipating heat generated by the electronic assembly. However, as explained in the modified embodiments as described above, the cold plate 330, the second water block 340, the first heat dissipation plate 150, and the second heat dissipation plate 160 are optional and may be omitted as required; that is, in some other embodiments, the water cooling heat dissipation device may include the first water block 310, the radiator 320, the cold plate 330, the second water block 340, and the first heat dissipation plate 150 but not include a second heat dissipation plate. Alternatively, in another embodiment, the water cooling heat dissipation device may include the first water block 310, the radiator 320, the cold plate 330, and the first heat dissipation plate 150 but not include a second water block and a second heat dissipation plate.

Figure 9:
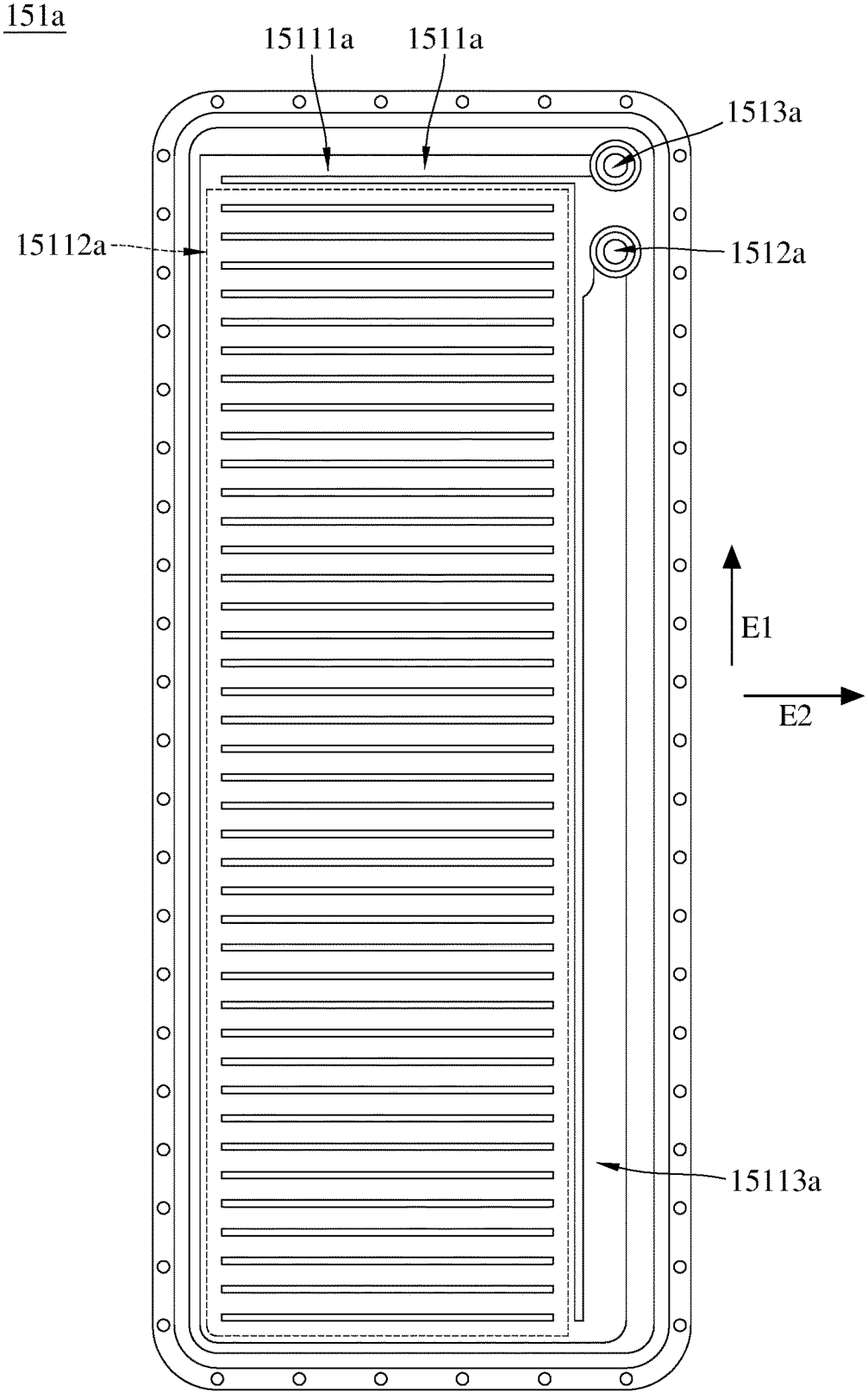
FIG. 9 is a schematic view of an inner plate of a first heat dissipation plate according to a second embodiment of the disclosure.

Referring to FIG. 9, FIG. 9 is a schematic view of an inner plate of a first heat dissipation plate according to a second embodiment of the disclosure.

The computer device of this embodiment is similar to the computer device 10 of the previous embodiment as described with reference to FIGS. 1 to 8, and the difference between them is mainly the structure of the inner plate of the first heat dissipation plate. Therefore, the following paragraphs will merely introduce an inner plate 151a of the first heat dissipation plate of this embodiment, and the same parts between them will be omitted hereinafter.

In this embodiment, the inner plate 151a has a groove 1511a, and a fluid inlet 1512a and a fluid outlet 1513a which are in fluid communication with the groove 1511a. The groove 1511a has a first communication area 15111a, a diffusion area 15112a, and a second communication area 15113a. The diffusion area 15112a, for example, has a plurality of transverse channels connected and parallel to each other. The first communication area 15111a and the second communication area 15113a are respectively in fluid communication with different sides of the diffusion area 15112a, and are respectively in fluid communication with the fluid outlet 1513a and the fluid inlet 1512a. As a result, the working fluid can flow into the first heat dissipation plate from the fluid inlet 1512a, then flow to the diffusion area 15112a through the second communication area 15113a and spread all over the diffusion area 15112a. Then, the working fluid flows through the first communication area 15111a and flows out of the first heat dissipation plate via the fluid outlet 1513a.

Figure 10:
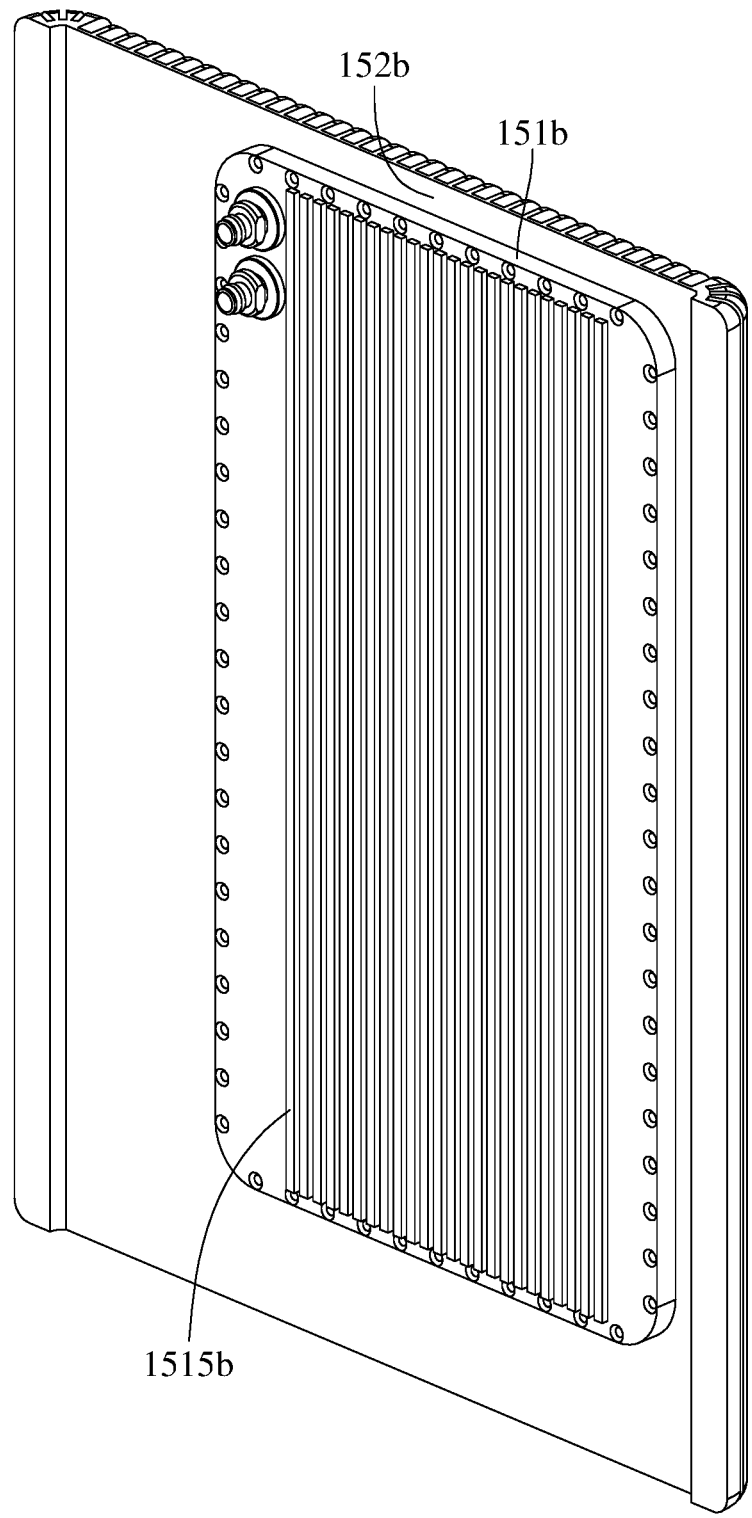
FIG. 10 is a perspective view of a first heat dissipation plate according to a third embodiment of the disclosure.
Figure 11:
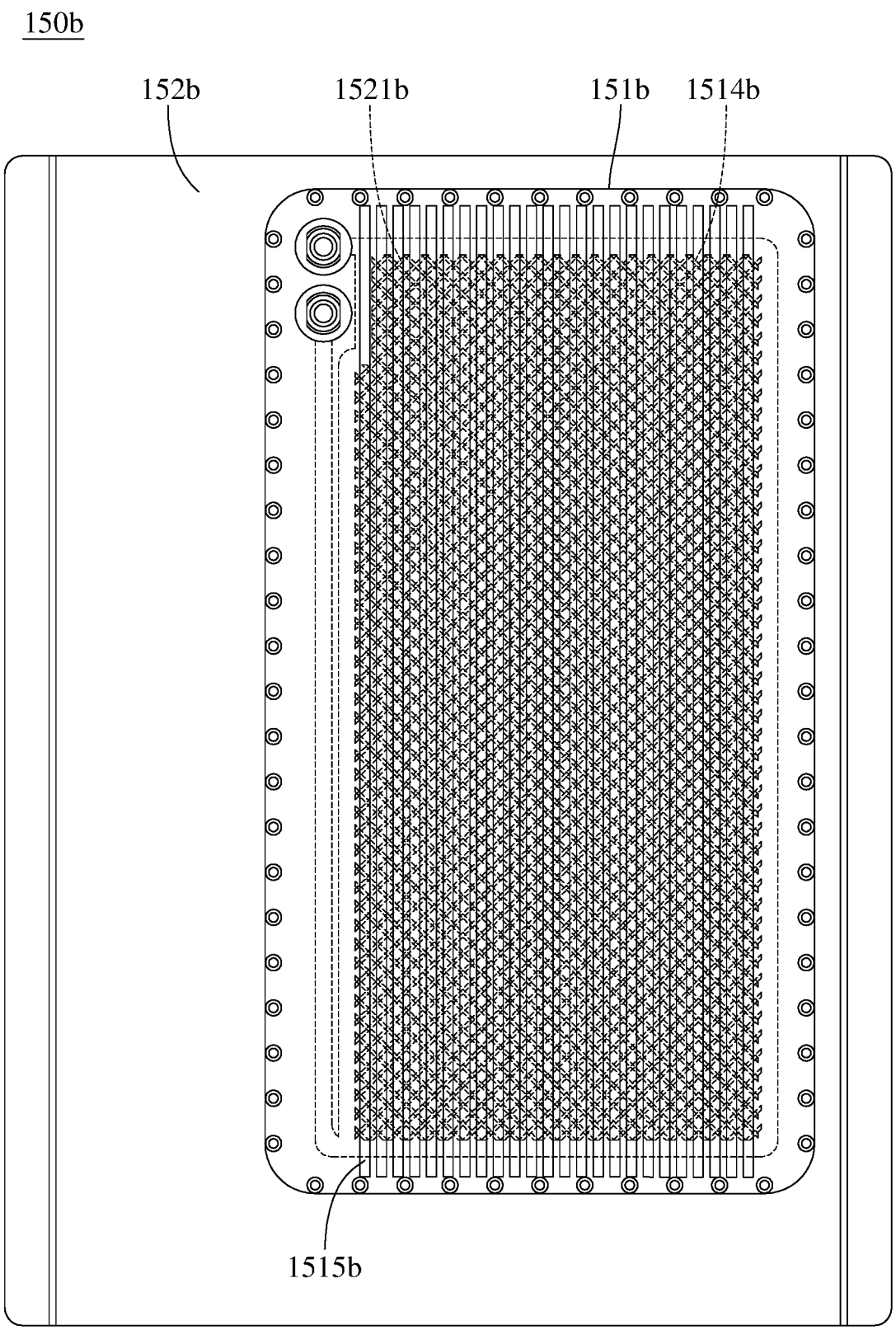
FIG. 11 is a schematic view of the first heat dissipation plate in FIG. 10.
Figure 12:
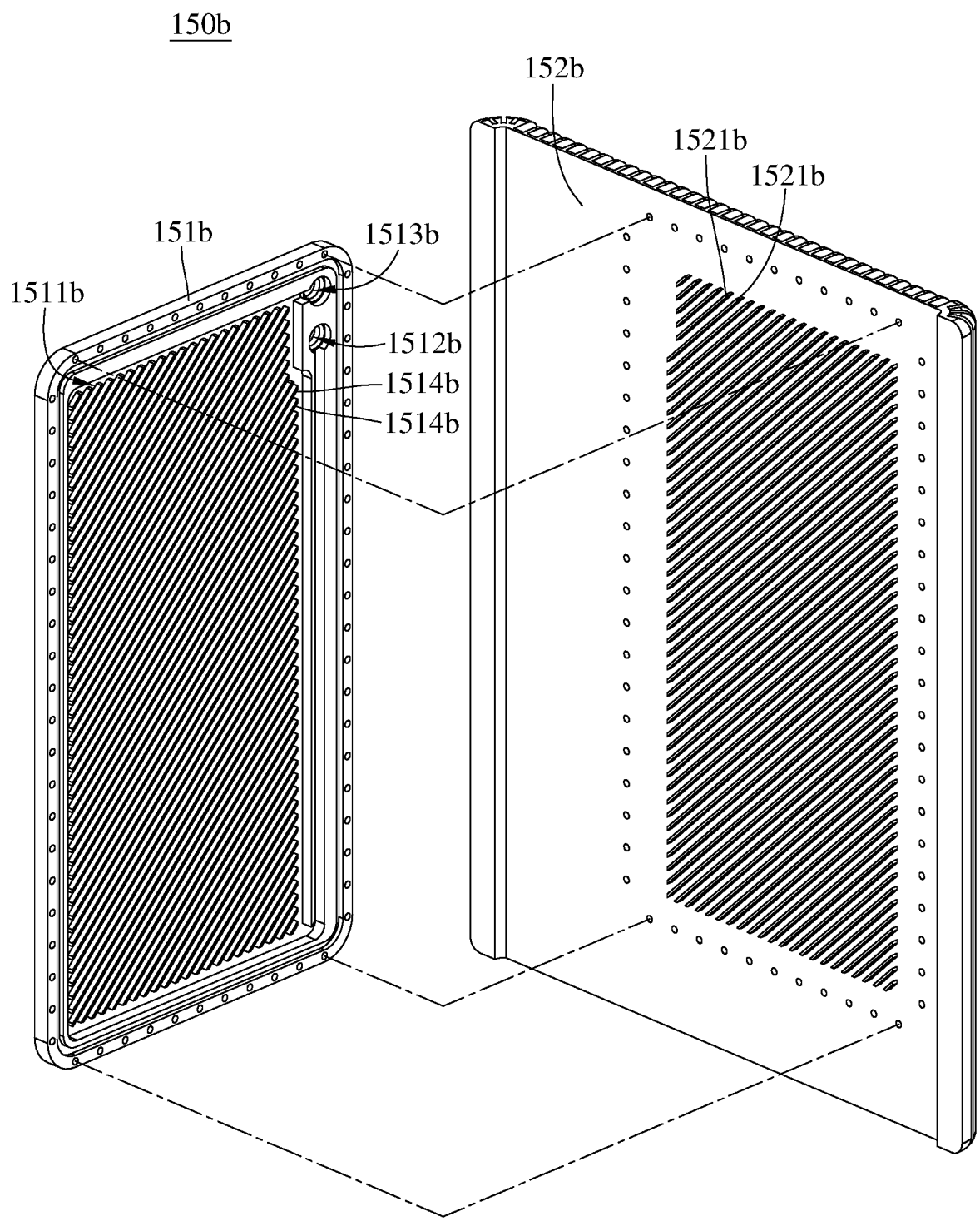
FIG. 12 is an exploded view of the first heat dissipation plate in FIG. 10.
Figure 13:
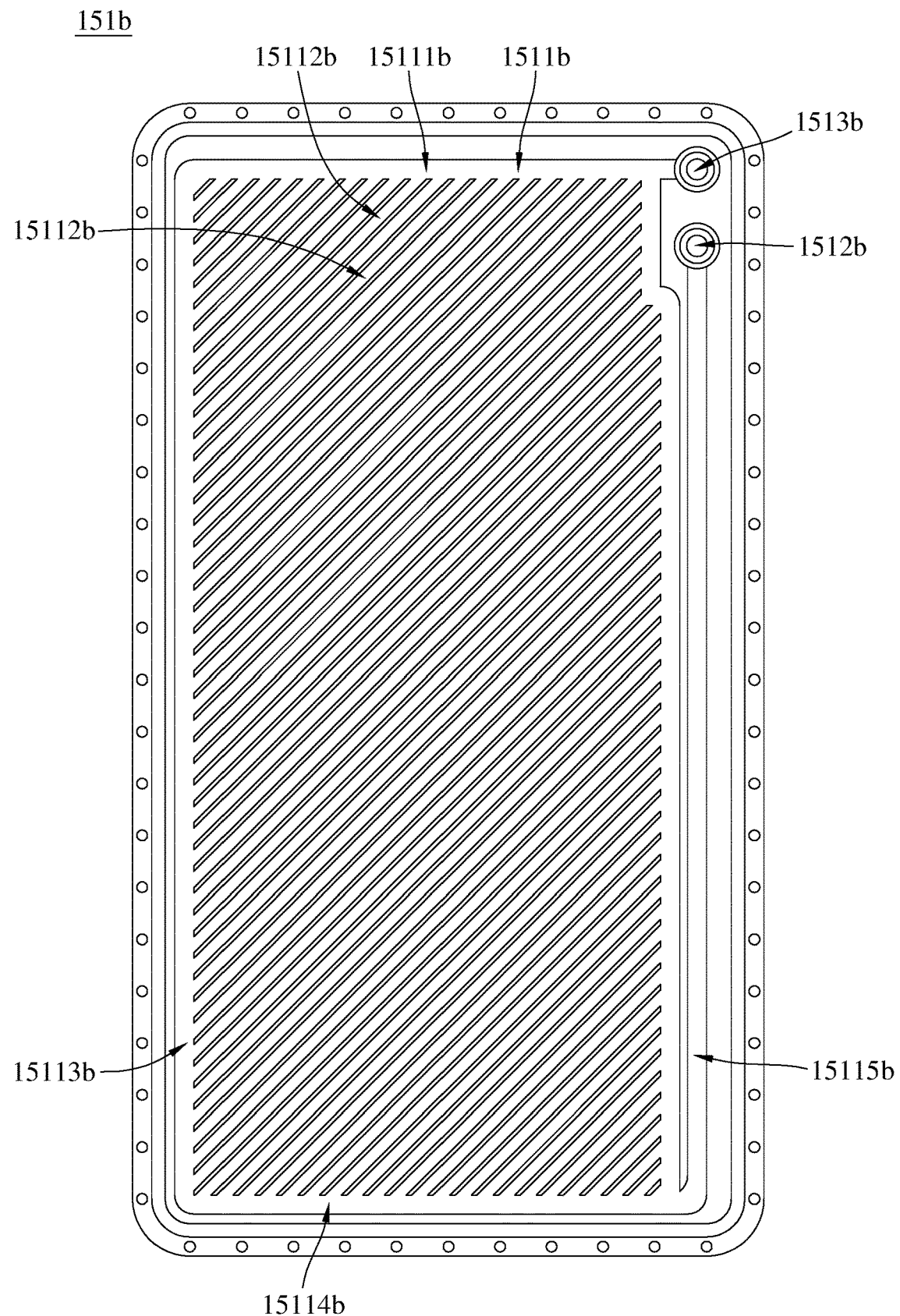
FIG. 13 is a schematic view of an inner plate of the first heat dissipation plate in FIG. 10.

Referring to FIGS. 10 to 13, FIG. 10 is a perspective view of a first heat dissipation plate according to a third embodiment of the disclosure, FIG. 11 is a schematic view of the first heat dissipation plate in FIG. 10, FIG. 12 is an exploded view of the first heat dissipation plate in FIG. 10, and FIG. 13 is a schematic view of an inner plate of the first heat dissipation plate in FIG. 10.

The computer device of this embodiment is similar to the computer device 10 of the previous embodiment as described with reference to FIGS. 1 to 8, and the difference between them is mainly the structure of the first heat dissipation plate. Therefore, the following paragraphs will merely introduce a first heat dissipation plate 150b of this embodiment, and the same parts between them will be omitted hereinafter.

In this embodiment, the first heat dissipation plate 150b includes an inner plate 151b and an outer plate 152b. The inner plate 151b has a groove 1511b, and a fluid inlet 1512b, and a fluid outlet 1513b which are in fluid communication with the groove 1511b. The outer plate 152b is stacked on the inner plate 151b and covers the groove 1511b of the inner plate 151b, such that the outer plate 152b and the inner plate 151b together surround an interior fluid channel.

The inner plate 151b has a plurality of inclined protrusions 1514b, a plurality of inclined channels 15112b, a first communication channel 15111b, a second communication channel 15113b, a third communication channel 15114b, and a fourth communication channel 15115b. The inclined channels 15112b are formed between the inclined protrusions 1514b. The first communication channel 15111b and the third communication channel 15114b are respectively in fluid communication with two opposite ends of the second communication channel 15113b, and the first communication channel 15111b, the second communication channel 15113b, and the third communication channel 15114b are located at a periphery of the inclined protrusions 1514b and in fluid communication with the inclined channels 15112b. The first communication channel 15111b is in fluid communication with the fluid outlet 1513b, and the third communication channel 15114b is in fluid communication with the fluid inlet 1512b via the fourth communication channel 15115b. The outer plate 152b has a plurality of inclined protrusions 1521b. The inclined protrusions 1521b and the inclined protrusions 1514b intersect with each other so as to form a fluid diffusion area. As a result, the working fluid can flow into the first heat dissipation plate 150b from the fluid inlet 1512b, then flow through the fourth communication channel 15115b, the third communication channel 15114b, and the second communication channel 15113b so as to flow into the fluid diffusion area and spread all over the fluid diffusion area. Then, the working fluid flows through the first communication channel 15111b and flows out of the first heat dissipation plate 150b via the fluid outlet 1513b.

Furthermore, the inner plate 151b may further have a plurality of heat dissipation protrusions 1515b for increasing the heat dissipation performance of the first heat dissipation plate 150b.

According to the computer devices, the casings, and the water cooling heat dissipation devices as described in the above embodiments, a part of the casing can be served as at least one heat dissipation plate for the working fluid to flow therein, such that the heat dissipation efficiency can be improved while not increasing the volume of the computer device as possible.

Moreover, the circulation channel is formed by connecting at least one water block, the radiator, the cold plate, and the heat dissipation plate via at least one pump, such that the heat dissipation efficiency can be further improved.

Furthermore, the airflow generator is disposed on the bottom side of the casing, such that the airflow produced by the airflow generator can help to take heat out of the accommodation space of the casing, thereby reducing the working temperature of the computer device.

In addition, the radiator is disposed on one side of the casing, and the radiator is, for example, the radiator of 240 mm.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. A computer device, comprising:
a casing, forming an accommodation space, wherein the casing has an interior fluid channel located at at least one side of the casing, and a fluid inlet and a fluid outlet which are in fluid communication with the interior fluid channel;

an electronic assembly, located in the accommodation space; and a water cooling assembly, comprising a first water block and a radiator, wherein the first water block is in thermal contact with the electronic assembly, the first water block, the radiator, and the interior fluid channel located at the at least one side of the casing are in fluid communication with each other so as to form a circulation channel, and the fluid inlet and the fluid outlet of the casing are respectively in fluid communication with the radiator and the first water block;

wherein the casing comprises a plurality of side plates and a first heat dissipation plate, the plurality of side plates and the first heat dissipation plate together form the accommodation space, and the interior fluid channel is located at the first heat dissipation plate;

wherein the casing further comprises a second heat dissipation plate, and the first heat dissipation plate and the second heat dissipation plate are respectively located at two opposite sides of the casing;

wherein the electronic assembly comprises a motherboard and a graphics card, the motherboard has a central processor, the graphics card has an image processor, the water cooling assembly further comprises a cold plate, the cold plate has an interior fluid channel, the first water block and the cold plate are respectively in thermal contact with the central processor and the image processor, and the first water block, the radiator, the interior fluid channel of the cold plate, the interior fluid channel of the first heat dissipation plate, and an interior fluid channel of the second heat dissipation plate are in fluid communication with each other so as to form the circulation channel.

2. The computer device according to claim 1, wherein the first heat dissipation plate includes an inner plate and an outer plate, the inner plate has a groove, and the outer plate is stacked on the inner plate and covers the groove of the inner plate, such that the outer plate and the inner plate together form the interior fluid channel.

3. The computer device according to claim 2, wherein the groove has a first communication area, a diffusion area, and a second communication area, the first communication area and the second communication area are respectively in fluid communication with two different sides of the diffusion area, and the first communication area and the second communication area are respectively in fluid communication with the fluid outlet and the fluid inlet of the casing.

4. The computer device according to claim 2, wherein the inner plate has a plurality of inclined protrusions, a plurality of inclined channels, a first communication channel, a second communication channel, and a third communication channel, the plurality of inclined channels are formed between the plurality of inclined protrusions, the first communication channel and the third communication channel are respectively in fluid communication with two opposite ends of the second communication channel, the first communication channel, the second communication channel, and the third communication channel are located at a periphery of the plurality of inclined protrusions and in fluid communication with the plurality of inclined channels, the first communication channel is in fluid communication with the fluid outlet of the casing, the third communication channel is in fluid communication with the fluid inlet of the casing, the outer plate has a plurality of inclined protrusions, and the plurality of inclined protrusions of the outer plate and the plurality of inclined protrusions of the inner plate intersect with each other so as to form a fluid diffusion area.

5. The computer device according to claim 2, wherein the outer plate has a plurality of heat dissipation fins.

6. The computer device according to claim 1, further comprising an airflow generator, wherein two of the plurality of side plates located at two opposite sides of the casing each have at least one vent hole, and the airflow generator is located adjacent to the at least one vent hole of one of the two of the plurality of side plates.

7. The computer device according to claim 1, wherein the water cooling assembly further comprises a second water block, and the first water block, the second water block, the radiator, the interior fluid channel of the cold plate, the interior fluid channel of the first heat dissipation plate, and the interior fluid channel of the second heat dissipation plate are in fluid communication with each other so as to form the circulation channel.

8. The computer device according to claim 7, wherein the water cooling assembly further comprises a first tube, a second tube, a third tube, a fourth tube, a fifth tube, and a sixth tube, a fluid outlet of the first water block is in fluid communication with a fluid inlet of the radiator via the first tube, a fluid outlet of the radiator is in fluid communication with a fluid inlet of the cold plate via the second tube, a fluid outlet of the cold plate is in fluid communication with a fluid inlet of the second water block via the third tube, a fluid outlet of the second water block is in fluid communication with a fluid inlet of the first heat dissipation plate via the fourth tube, a fluid outlet of the first heat dissipation plate is in fluid communication with a fluid inlet of the second heat dissipation plate via the fifth tube, and a fluid outlet of the second heat dissipation plate is in fluid communication with a fluid inlet of the first water block via the sixth tube.

9. The computer device according to claim 7, wherein at least one of the first water block and the second water block has a pump.

10. The computer device according to claim 1, wherein the cold plate comprises a main part, a first cover part, a second cover part, and a third cover part, the main part has a first channel, a second channel, a third channel, a fourth channel, a fifth channel, and a sixth channel, the first channel, the third channel, the fifth channel, and the sixth channel are located at one side of the main part and spaced apart from one another, the second channel and the fourth channel are located at another side of the main part and spaced apart from each other, the first channel is in fluid communication with the third channel via the second channel, the third channel is in fluid communication with the fifth channel via the fourth channel, the first cover part has a communication channel, the first cover part covers the first channel, the fifth channel, and the sixth channel, the fifth channel is in fluid communication with the sixth channel via the communication channel of the first cover part, the second cover part covers the third channel, and the third cover part covers the second channel and the fourth channel.

11. A casing, comprising a plurality of side plates and a first heat dissipation plate, wherein the plurality of side plates and the first heat dissipation plate together form an accommodation space, and the first heat dissipation plate has an interior fluid channel, and a fluid inlet and a fluid outlet which are in fluid communication with the interior fluid channel;

wherein the first heat dissipation plate includes an inner plate and an outer plate, the inner plate has a groove, the outer plate is stacked on the inner plate and covers the groove of the inner plate, such that the outer plate and the inner plate together form the interior fluid channel;

wherein the inner plate has a plurality of inclined protrusions, a plurality of inclined channels, a first communication channel, a second communication channel, and a third communication channel, the plurality of inclined channels are formed between the plurality of inclined protrusions, the first communication channel and the third communication channel are respectively in fluid communication with two opposite ends of the second communication channel, the first communication channel, the second communication channel, and the third communication channel are located at a periphery of the plurality of inclined protrusions and in fluid communication with the plurality of inclined channels, the first communication channel is in fluid communication with the fluid outlet of the first heat dissipation plate, the third communication channel is in fluid communication with the fluid inlet of the first heat dissipation plate, the outer plate has a plurality of inclined protrusions, and the plurality of inclined protrusions of the outer plate and the plurality of inclined protrusions of the inner plate intersect with each other so as to form a fluid diffusion area.

12. The casing according to claim 11, wherein the outer plate has a plurality of heat dissipation fins.

13. The casing according to claim 11, further comprising a second heat dissipation plate, wherein the first heat dissipation plate and the second heat dissipation plate are respectively located at two opposite sides of the casing.

14. The casing according to claim 11, wherein at least one of the plurality of side plates has at least one vent hole.

15. A water cooling heat dissipation device, configured to be thermally coupled with two heat sources, the water cooling heat dissipation device comprising:
 a first water block, having a fluid inlet and a fluid outlet;
 a cold plate, having a fluid inlet and a fluid outlet, wherein the first water block and the cold plate are respectively and thermally coupled with the heat sources;
 a radiator, having a fluid inlet and a fluid outlet, wherein the fluid inlet and the fluid outlet of the radiator are respectively in fluid communication with the fluid outlet of the first water block and the fluid inlet of the cold plate; and
 a first heat dissipation plate, having an interior fluid channel, and a fluid inlet and a fluid outlet which are in fluid communication with the interior fluid channel, the fluid inlet and the fluid outlet of the first heat dissipation plate are respectively in fluid communication with the fluid outlet of the cold plate and the fluid inlet of the first water block;
 wherein the first heat dissipation plate is an exterior part of a computer device.

16. The water cooling heat dissipation device according to claim 15, further comprising a second water block and a second heat dissipation plate, wherein the fluid outlet of the cold plate is in fluid communication with the fluid inlet of the first heat dissipation plate via the second water block, and the fluid outlet of the first heat dissipation plate is in fluid communication with the fluid inlet of the first water block via the second heat dissipation plate.

\* \* \* \* \*